United States Patent
Tian et al.

(10) Patent No.: US 9,082,727 B2
(45) Date of Patent: Jul. 14, 2015

(54) TOUCH DETECTING STRUCTURE, TOUCH DISPLAY DEVICE AND TOUCH DETECTING AND MANUFACTURING METHODS

(71) Applicants: Shanghai Tianma Micro-Electronics Co., Ltd., Shanghai (CN); Tianma Micro-Electronics Co., Ltd., Shenzhen (CN)

(72) Inventors: Kai Tian, Shanghai (CN); Yujun Li, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/222,435

(22) Filed: Mar. 21, 2014

(65) Prior Publication Data

US 2015/0108434 A1    Apr. 23, 2015

(30) Foreign Application Priority Data

Oct. 23, 2013 (CN) .......................... 2013 1 0504949

(51) Int. Cl.
*H01L 29/08* (2006.01)
*H01L 27/32* (2006.01)
*H01L 51/56* (2006.01)

(52) U.S. Cl.
CPC .............. *H01L 27/323* (2013.01); *H01L 51/56* (2013.01); *H01L 2251/558* (2013.01)

(58) Field of Classification Search
CPC ........ H01L 27/32; H01L 27/323; H01L 51/56; H01L 2251/558
USPC ................................................. 257/40, 59, 72
See application file for complete search history.

(56) References Cited

U.S. PATENT DOCUMENTS

| 8,330,675 B2 * | 12/2012 | Choi ................................ 345/46 |
| 2012/0037916 A1 * | 2/2012 | Song et al. ....................... 257/72 |
| 2013/0240855 A1 * | 9/2013 | Chida et al. ...................... 257/40 |

FOREIGN PATENT DOCUMENTS

CN    102109691 A    6/2011

* cited by examiner

*Primary Examiner* — Hung Vu
(74) *Attorney, Agent, or Firm* — Kilpatrick Townsend & Stockton LLP

(57) ABSTRACT

The invention discloses a touch detecting structure, an organic light emitting touch display device, a method of detecting a touch on a device and a method of manufacturing a device. The touch detecting structure includes: a first signal transmission line arranged on a first substrate of an organic light emitting touch display device; an insulating layer arranged on the first signal transmission line and having a via hole and a protrusion; a second signal transmission line located on the insulating layer and passing the top of the protrusion; a signal transmission terminal arranged on the lateral surface of the protrusion and having one end connected with the first signal transmission line through the via hole and the other end located on the top of the protrusion, and insulated from the second signal transmission line; and a cathode film arranged on a second substrate.

13 Claims, 5 Drawing Sheets

TOUCH DETECTING STRUCTURE, TOUCH DISPLAY DEVICE AND TOUCH DETECTING AND MANUFACTURING METHODS

CROSS-REFERENCES TO RELATED APPLICATIONS

This application claims the benefit of priority to Chinese Patent Application No. 201310504949.0, filed with the Chinese Patent Office on Oct. 23, 2013 and entitled "TOUCH DETECTING STRUCTURE, TOUCH DISPLAY DEVICE AND TOUCH DETECTING AND MANUFACTURING METHODS", the content of which is incorporated herein by reference in its entirety.

FIELD OF THE INVENTION

The present invention relates to the field of OLED display technologies, and particularly to a touch detecting structure, an organic light emitting touch display device and touch detecting and manufacturing methods.

BACKGROUND OF THE INVENTION

Organic light emitting diode (OLED) display technologies adopt an organic material coating and have the characteristic of self-illumination. An OLED display screen is widely used due to its large viewable angle and power saving characteristics.

With the development of the touch technology, touch panels are added to most portable display screens (such as OLED display screens), so that users may perform a direct operation on the screens via a touch pen or finger.

BRIEF SUMMARY OF THE INVENTION

In view of this, the present invention provides a touch detecting structure, an organic light emitting touch display device, a method of detecting a touch on a device and a method of manufacturing a device.

An embodiment of the invention provides a touch detecting structure, including: a first signal transmission line, arranged on a first substrate of an organic light emitting touch display device and located on the surface of the first substrate opposite to a second substrate of the organic light emitting touch display device; an insulating layer, arranged on the first signal transmission line and provided with a via hole and a protrusion; a second signal transmission line, located on the insulating layer and passing the top of the protrusion; a signal transmission terminal, arranged on the lateral surface of the protrusion, having one end connected with the first signal transmission line through the via hole and the other end located on the top of the protrusion, and insulated from the second signal transmission line; a cathode film, arranged on the second substrate and located on the surface of the second substrate opposite to the first substrate; wherein when the first substrate is not pressed, the second signal transmission line and the signal transmission terminal are not in contact with the cathode film; and when the first substrate is pressed, the second signal transmission line and the signal transmission terminal are in conductive connection with the cathode film.

The above-described touch detecting structure is arranged inside the organic light emitting display device, rather than outside the organic light emitting display device, thus reducing the thickness of the organic light emitting display device and lightening the weight of the organic light emitting display device.

An embodiment of the invention provides an organic light emitting touch display device, including a first substrate and a second substrate arranged oppositely, wherein the second substrate is provided on the side opposite to the first substrate with an organic light emitting layer, and a cathode film covers the organic light emitting layer. The device further includes: a group of parallel first signal transmission lines, arranged on the side of the first substrate opposite to the second substrate; an insulating layer, arranged on the first signal transmission lines and provided with multiple protrusions and via holes; a group of parallel second signal transmission lines, arranged on the insulating layer, and passing the tops of the protrusions; and signal transmission terminals, arranged on lateral surfaces of the respective protrusions, wherein one end of each signal transmission terminal is connected with a first signal transmission line through a via hole, the other end of each signal transmission terminal is located on the top of a protrusion, and the signal transmission terminals are insulated from the second signal transmission lines; the cathode film is located on the surface of the second substrate opposite to the first substrate; when the first substrate is not pressed, the second signal transmission lines and the signal transmission terminals are not in contact with the cathode film; and when the first substrate is pressed, the second signal transmission lines and the signal transmission terminals are in direct conductive connection with the cathode film.

The touch detecting structure is arranged inside a display of the above-described organic light emitting display device, rather than outside the display, thus reducing the thickness of the organic light emitting display device and lightening the weight of the organic light emitting display device.

An embodiment of the invention also provides a method of manufacturing an organic light emitting touch display device, including: forming an organic light emitting layer on the side of a second substrate opposite to a first substrate, and covering the organic light emitting layer with a cathode film; depositing a first conductive layer on the side of the first substrate opposite to the second substrate, and etching the first conductive layer to form a group of parallel first signal transmission lines; depositing an insulating layer on the first signal transmission lines; etching the insulating layer to form via holes, and forming protrusions on the insulating layer; depositing a second conductive layer on the insulating layer where the protrusions and the via holes are formed, and etching the second conductive layer to form a group of parallel second signal transmission lines and multiple signal transmission terminals, wherein the second signal transmission lines pass the tops of the protrusions and are vertical to the first signal transmission lines, the signal transmission terminals are located on the lateral surfaces of the protrusions, one end of each signal transmission terminal is connected with a first signal transmission line through a via hole, the other end of each signal transmission terminal is located on the top of a protrusion, and the signal transmission terminals are insulated from the second signal transmission lines; and performing box aligning on the treated first substrate and the second substrate provided with the cathode film, wherein the surface of the first substrate provided with the first signal transmission lines, the insulating layer, the second signal transmission lines and the signal transmission terminals is opposite to the surface of the second substrate provided with the cathode film after box aligning.

The touch detecting structure is located in the organic light emitting touch display device formed by using the above-described method, thus reducing the thickness and the weight of the device.

BRIEF DESCRIPTION OF THE DRAWINGS

Accompanying drawings provided in embodiments of the invention are merely for illustrative purposes, and are not limiting.

DETAILED DESCRIPTION OF THE INVENTION

Embodiments of the invention provide a touch detecting structure, an organic light emitting touch display device, a method of detecting a touch on a device, and a method of manufacturing a device to solve the problems of increasing thickness and weight of a display.

A clear and complete description of technical solutions in embodiments of the invention will be given below, in conjunction with the accompanying drawings in the embodiments of the invention. Various embodiments are described herein by way of example, and features described with respect to different embodiments may be combined and interchanged, without departing from the scope or spirit of the present invention.

Figure 1:
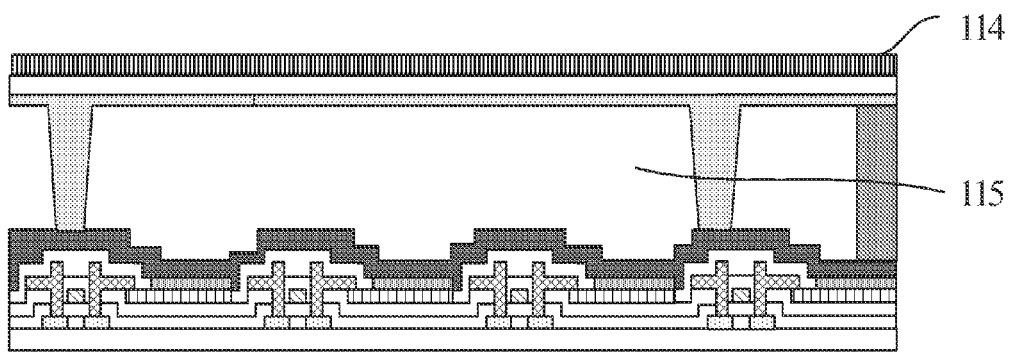
FIG. 1 is a schematic diagram of an OLED touch display device.

FIG. 1 is a cross-sectional view of an organic light emitting touch display device including a touch panel 114, which is disposed outside an OLED display screen 115. Such arrangement is disadvantageous in reducing thickness and weight of a display.

Figure 2:
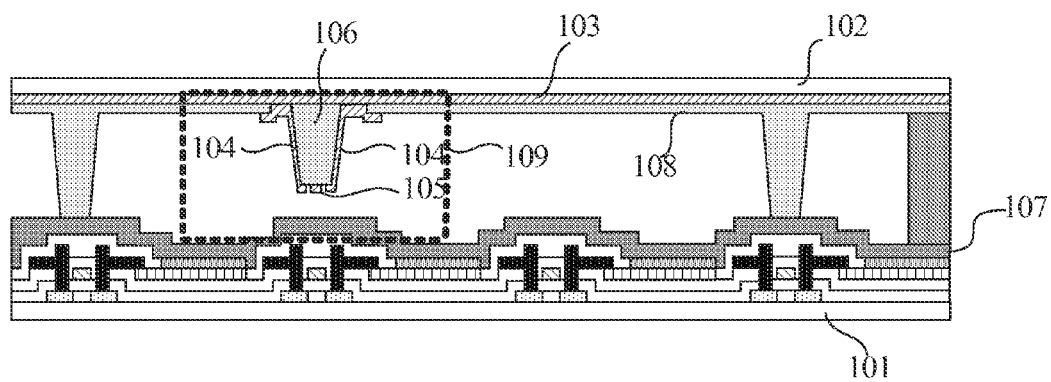
FIG. 2 is a schematic diagram of an organic light emitting touch display device according to an embodiment of the invention.

FIG. 2 illustrates a schematic diagram of an organic light emitting touch display device including a touch detecting structure 109. As shown, the touch detecting structure 109 is arranged in a space where a first substrate 102 of the organic light emitting touch display device is opposite to a second substrate 101 of the organic light emitting touch display device. The touch detecting structure 109 successively includes:

multiple first signal transmission lines 103 arranged inside the first substrate 102 of the organic light emitting touch display device;

an insulating layer 108, arranged below the first signal transmission lines 103 and having multiple protrusions 106 facing the second substrate 101 and multiple via holes, wherein the via holes are located on one side or both sides of a protrusion 106;

multiple second signal transmission lines 105 located below the insulating layer 108 and passing the top of the protrusions 106;

multiple signal transmission terminals 104 arranged on lateral surfaces of the protrusions 106, wherein one end of each signal transmission terminal is connected with a first signal transmission line 103 through a via hole, the other end of each signal transmission terminal is located on the top of a protrusion 106, and the signal transmission terminals 104 are insulated from the second signal transmission lines 105; and a cathode film 107, arranged on the second substrate 101 and located on the surface of the second substrate 101 opposite to the first substrate 102, wherein the cathode film is an OLED cathode film and may be made of an MgAg film.

When the first substrate 102 is not pressed, the second signal transmission lines 105 and the signal transmission terminals 104 are not in contact with the cathode film 107.

When the first substrate 102 is pressed, the second signal transmission lines 105 and the signal transmission terminals 104 are in conductive connection with the cathode film 107.

As used herein, the terms "inside", "below" and the like are used with reference to the orientations of the Figures being described. Because components of embodiments of the present invention can be positioned in a number of different orientations, the terms are used for purposes of illustration and are not limiting.

The above-described touch detecting structure 109 is arranged inside the organic light emitting display device, rather than on the surface of the organic light emitting display device, thus reducing the thickness and weight of the touch display device.

In an embodiment, a portion of the above-described cathode film 107 opposite to the top of the protrusion 106 is parallel to the end faces of the above-described signal transmission terminals 104 on the top of the protrusions 106, thus ensuring that the signal transmission terminals 104 is in full conductive connection with the cathode film 107 when the first substrate 102 is pressed.

Based on any above-described embodiment of the touch detecting structure, optionally, the end part of each signal transmission terminal 104 on the top of the protrusion 106 has the same thickness as the second signal transmission line 105 on the top of the protrusion 106. In this case, the surfaces of the parts of the signal transmission terminals 104 and the second signal transmission lines 105 on the top of the protrusion 106 are on the same plane, thus ensuring that the signal transmission terminals 104 and the second signal transmission lines 105 are in full conductive connection with the cathode film 107 respectively when the first substrate 102 is pressed. Since the signal transmission terminals 104 and the second signal transmission lines 105 on the top of the protrusion 106 have the same thickness, a distance should be kept between the signal transmission terminals 104 and the second signal transmission lines 105 to prevent short circuit and crosstalk when the first substrate 102 is not pressed, and the distance may be set according to actual needs.

In an embodiment, the first signal transmission lines 103, the second signal transmission lines 105 and the signal transmission terminals 104 are made of indium tin oxide (ITO), and the insulating layer 108 is made of an organic film.

Based on any above-described embodiment of the touch detecting structure, optionally, the above-described protrusions 106, the signal transmission terminals 104 and the second signal transmission lines 105 may be set in any of the following implementations.

Figure 3A:
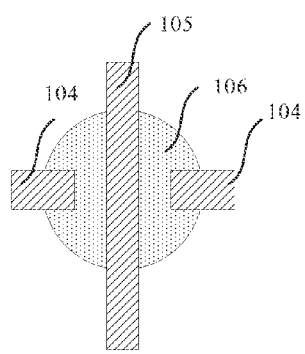
FIG. 3a to FIG. 3c are schematic diagrams of position relations among a second signal transmission line, a signal transmission terminal and a protrusion in a touch detecting structure according to an embodiment of the invention.

In the touch detecting structure shown in FIG. 3a, an implementation of the position relation among a second signal transmission line 105, signal transmission terminals 104 and a protrusion 106 on the end face of the protrusion 106 is as follows: the signal transmission terminals 104 are arranged oppositely on both sides of the protrusion 106, and the second signal transmission line 105 passes the top center of the protrusion 106.

Figure 3B:
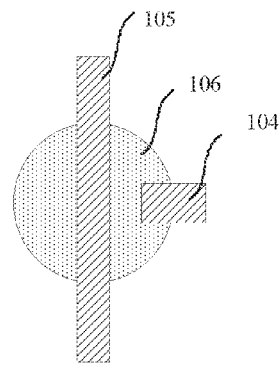

In the touch detecting structure shown in FIG. 3b, another implementation of the position relation among a second signal transmission line 105, a signal transmission terminal 104 and a protrusion 106 on the end face of the protrusion 106 is as follows: the signal transmission terminal 104 is arranged on one side of the protrusion 106, and the second signal transmission line 105 passes the top center of the protrusion 106.

Figure 3C:
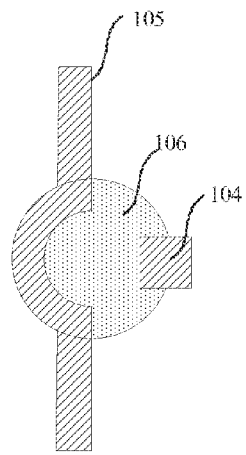

In the touch detecting structure shown in FIG. 3c, yet another implementation of the position relation among a second signal transmission line 105, a signal transmission terminal 104 and a protrusion 106 on the end face of the protrusion 106 is as follows: the signal transmission terminal 104 is arranged on one side of the protrusion 106, and the second signal transmission line 105 passes along a top edge of the protrusion 106.

Based on any above-described embodiment of the touch detecting structure, optionally, the projections of the second signal transmission lines 105 on the second substrate 101 is vertical to the projections of the first signal transmission lines 103 on the second substrate 101.

An embodiment of the invention also provides an organic light emitting touch display device. As shown in FIG. 2, the organic light emitting touch display device includes:

a first substrate 102 and a second substrate 101 arranged oppositely, wherein the second substrate 101 is provided on the side opposite to the first substrate 102 with an organic light emitting layer, and a cathode film 107 covers the organic light emitting layer.

a group of parallel first signal transmission lines 103 is arranged on the side of the first substrate 102 opposite to the second substrate 101;

an insulating layer 108 is arranged below the first signal transmission lines 103 and provided with multiple protrusions 106 facing the second substrate and with via holes, and the via holes are located on one side or both sides of a protrusion 106;

a group of parallel second signal transmission lines 105 is arranged below the insulating layer 108, and passes the tops of the protrusions 106;

signal transmission terminals 104 are arranged on the lateral surfaces of the respective protrusions 106, wherein one end of each signal transmission terminal 104 is connected with a first signal transmission line 103 through a via hole, the other end of each signal transmission terminal 104 is located on the top of a protrusion 106, and the signal transmission terminals 104 are insulated from the second signal transmission lines 105; and the cathode film 107 is located on the surface of the second substrate 101 opposite to the first substrate 102.

When the first substrate 102 is not pressed, the second signal transmission lines 105 and the signal transmission terminals 104 are not in contact with the cathode film 107.

When the first substrate 102 is pressed, the second signal transmission lines 105 and the signal transmission terminals 104 are in direct conductive connection with the cathode film 107.

In an embodiment, the projections of the second signal transmission lines 105 on the second substrate 101 are vertical to the projections of the first signal transmission lines 103 on the second substrate 101.

The distribution density of the group of parallel first signal transmission lines 103, the group of parallel second signal transmission lines 105 and the signal transmission terminals 104 in the organic light emitting touch display device may be set according to actual conditions and needs. The above-described organic light emitting touch display device has the same inventive concept as the structure. For the connection relation and shape of the components, reference may be made to the above-described description of the structure, which is not described redundantly herein.

Figure 4:
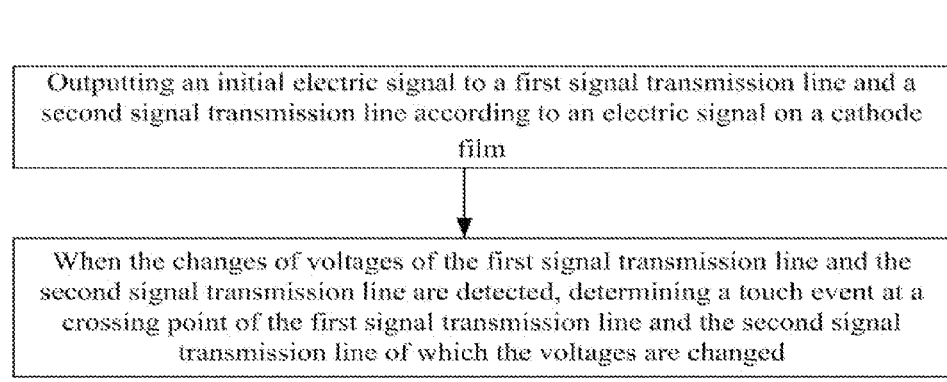
FIG. 4 is a flow diagram of a method of detecting a touch according to an embodiment of the invention.

FIG. 4 is a flow diagram of a method of detecting a touch according to an embodiment of the invention. The embodiment of the invention also provides a method of detecting a touch on the above-described organic light emitting touch display device. As shown in FIG. 4, the method includes:

S1: outputting an initial electric signal to a first signal transmission line 103 and a second signal transmission line 105 according to an electric signal on a cathode film; and S2: when the changes of voltages of the first signal transmission line 103 and the second signal transmission line 105 are detected, determining a touch event at a crossing point of the first signal transmission line 103 and the second signal transmission line 105 of which the voltages are changed.

Figure 5A:
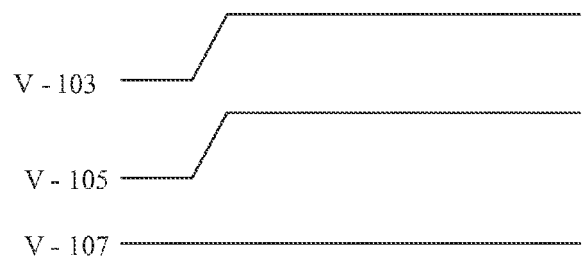
FIG. 5a is an initial voltage time sequence diagram of a first signal transmission line, a second signal transmission line and a cathode film in a touch detecting structure according to an embodiment of the invention.

In an embodiment, when the electric signal connected to the cathode film 107 is at a low level, the specific implementation of outputting the initial electric signal to the first signal transmission line 103 and the second signal transmission line 105 is to output an electric signal at a high level to the first signal transmission line 103 and the second signal transmission line 105. FIG. 5a shows an initial voltage time sequence diagram of the first signal transmission line 103, the second signal transmission line 105 and the cathode film 107 in the touch detecting structure.

Figure 5B:
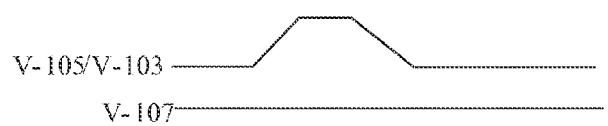
FIG. 5b is a voltage time sequence diagram of a first signal transmission line, a second signal transmission line and a cathode film in an organic light emitting touch display device when a touch event occurs according to an embodiment of the invention.

When the first substrate is pressed, the second signal transmission line 105 and the signal transmission terminal 104 on the protrusion at the touch position of the first substrate are in conductive connection with the cathode film 107, and the voltage of the second signal transmission line 105 on the protrusion at the touch position of the first substrate and the voltage of the first signal transmission line 103 connected with the signal transmission terminal 104 are reduced. FIG. 5b shows a voltage time sequence diagram of the first signal transmission line 103, the second signal transmission line 105 and the cathode film 107 in the organic light emitting touch display device when a touch event occurs. The touch position may be detected by detecting voltage changes.

Figure 6A:
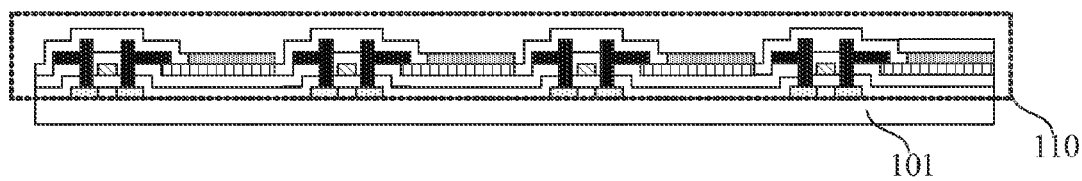
FIG. 6a to FIG. 6g are schematic diagrams of a method of manufacturing an organic light emitting touch display device according to an embodiment of the invention.
Figure 6B:
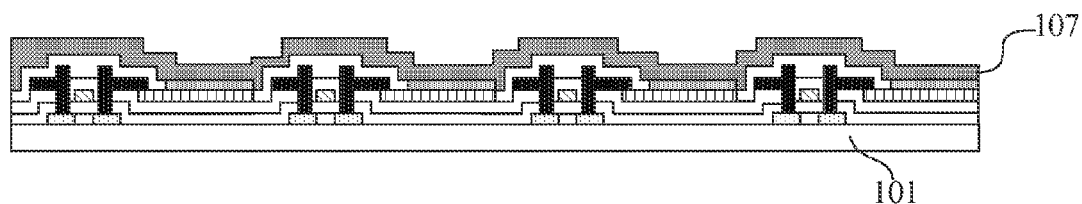
Figure 6C:
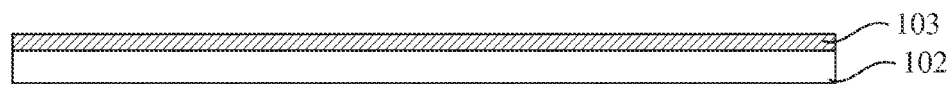
Figure 6D:
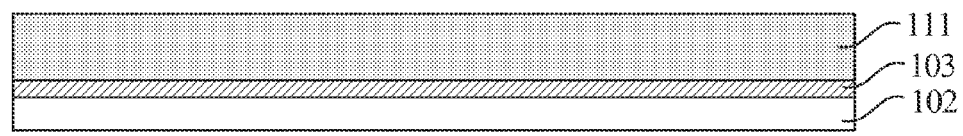
Figure 6E:
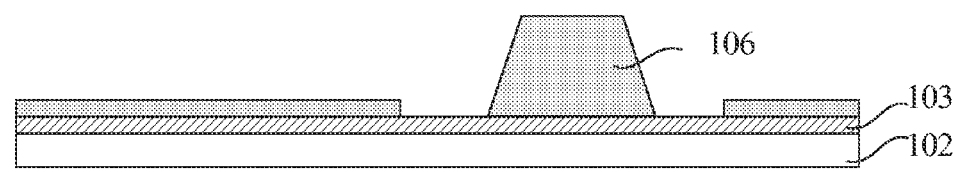
Figure 6F:
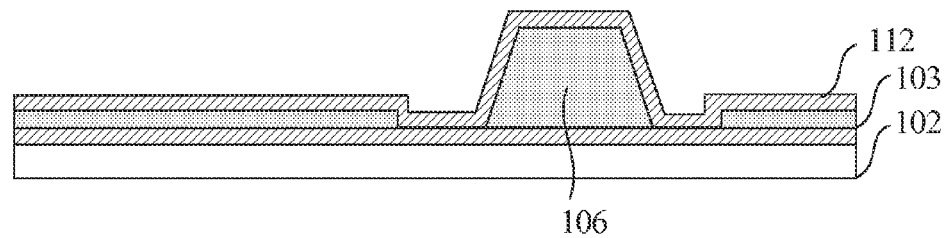
Figure 6G:
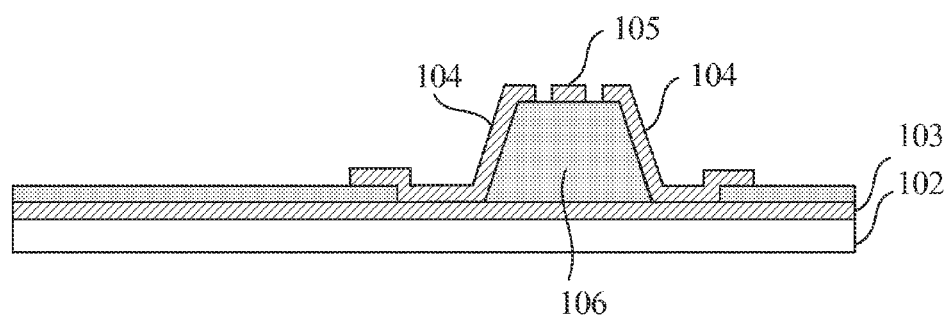

An embodiment of the invention also provides a method of manufacturing an organic light emitting touch display device. FIG. 6a to FIG. 6g are schematic diagrams illustrating the method of manufacturing the organic light emitting touch display device according to the embodiment of the invention. The method includes:

forming an organic light emitting layer 110 on a surface of a second substrate 101 opposite to a first substrate 102, as shown in FIG. 6a;

covering the organic light emitting layer 110 with a cathode film 107, as shown in FIG. 6b;

depositing a first conductive layer on a surface of the first substrate 102 opposite to the second substrate 101, and etching the first conductive layer to form a group of parallel first signal transmission lines 103, as shown in FIG. 6c;

depositing an insulating layer 111 on the first signal transmission lines 103, as shown in FIG. 6d;

etching the insulating layer 111 to form multiple via holes and protrusions 106 on the insulating layer, as shown in FIG. 6e, wherein the protrusions 106 and the via holes are located above the first signal transmission lines 103, and the via holes are located on two opposite sides of a protrusion 106 (it should be noted that a via hole may be formed on only one side of the protrusion 106);

depositing a second conductive layer 112 on the insulating layer 111 where the protrusions 106 and the via holes are formed, as shown in FIG. 6f, wherein the second conductive layer 112 is in contact with the first signal transmission lines 103 through the via holes;

etching the second conductive layer 112 to form a group of parallel second signal transmission lines 105 and multiple signal transmission terminals 104, as shown in FIG. 6g, wherein the second signal transmission lines 105 pass the tops of the protrusions 106, the signal transmission terminals 104 are located on the lateral surfaces of the protrusions 106, one end of each signal transmission terminal 104 is connected with a first signal transmission line 103 through a via hole, the other end of each signal transmission terminal 104 is located on the top of a protrusion, and the signal transmission terminals 104 are insulated from the second signal transmission lines 105; and performing box aligning on the treated first substrate 102 and the second substrate 101 provided with the cathode film 107, wherein a sealant may be used for box aligning herein.

After box aligning, the surface of the first substrate 102 provided with the first signal transmission lines 103, the insulating layer 111, the second signal transmission lines 105 and the signal transmission terminals 104 is opposite to the surface of the second substrate 101 provided with the cathode film 107.

Figure 7A:
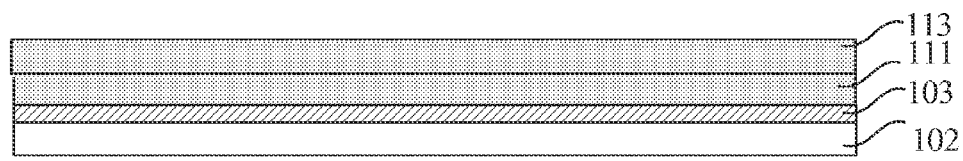
FIG. 7a to FIG. 7c are schematic diagrams of a method of manufacturing via holes and protrusions according to an embodiment of the invention.
Figure 7B:
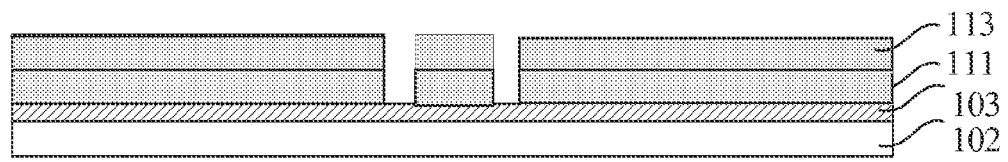
Figure 7C:
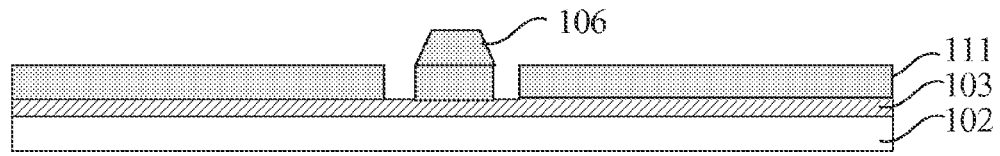
Figure 8A:
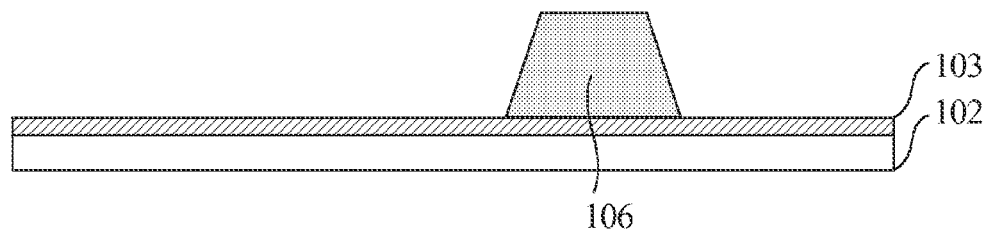
FIG. 8a to FIG. 8c are schematic diagrams of another method of manufacturing via holes and protrusions according to an embodiment of the invention.
Figure 8B:
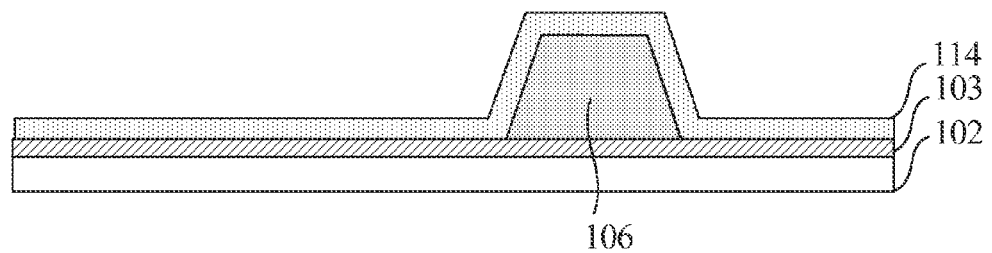
Figure 8C:
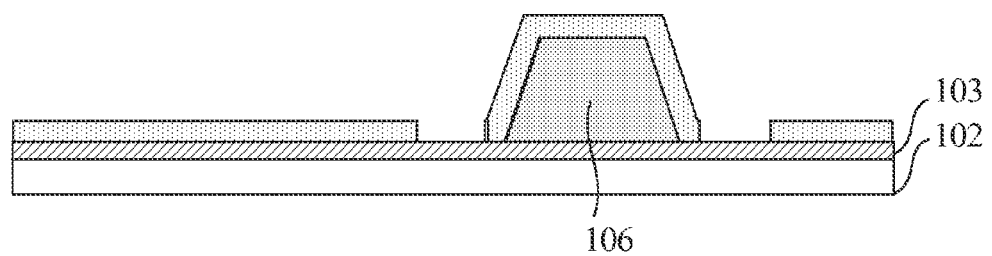

The protrusions and the via holes may be formed in the following three implementations, but not limited to the three implementations, wherein FIG. 7a to FIG. 7c are schematic diagrams of a method of manufacturing via holes and protrusions according to an embodiment of the invention, and FIG. 8a to FIG. 8c are schematic diagrams of another method of manufacturing via holes and protrusions in an embodiment of the invention.

In an implementation, the insulating layer 111 is etched to form multiple via holes and protrusions, namely, the protrusions 106 and the via holes are formed simultaneously, as shown in FIG. 6e.

In another implementation, an insulating layer 113 is deposited on the insulating layer 111, as shown in FIG. 7a; the insulating layer 111 and the insulating layer 113 are etched to form multiple via holes, as shown in FIG. 7b; and the insulating layer 113 where the via holes are formed is etched to form protrusions 106, as shown in FIG. 7c.

In yet another implementation, protrusions 106 are formed after or when the first signal transmission lines are formed, as shown in FIG. 8a; then an insulating layer 114 is coated, as shown in FIG. 8b; and the insulating layer 114 is etched to form via holes, as shown in FIG. 8c.

In an embodiment, the projections of the second signal transmission lines 105 on the second substrate 102 are vertical to the projections of the first signal transmission lines 103 on the second substrate 102.

FIG. 6a to FIG. 6g, FIG. 7a to FIG. 7c and FIG. 8a to FIG. 8c above are merely examples, and do not specifically limit the quantity, position relation and other features of components.

The organic light emitting touch display device shown in FIG. 2 is formed using the above-described method, and the touch detecting structure is located inside the organic light emitting touch display device, thus reducing the thickness and weight of the device.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

What is claimed is:

1. A touch detecting structure comprising:
   a first signal transmission line arranged on a surface of a first substrate of an organic light emitting touch display device opposite to a second substrate of the organic light emitting touch display device;
   an insulating layer arranged on the first signal transmission line and having a via hole and a protrusion;
   a second signal transmission line located on the insulating layer and passing a top of the protrusion;
   a first signal transmission terminal arranged on a first lateral surface of the protrusion and having one end connected with the first signal transmission line through the via hole and an opposite end located on the top of the protrusion, the first signal transmission terminal being insulated from the second signal transmission line; and
   a cathode film arranged on a surface of the second substrate opposite to the first substrate;
   wherein, when the first substrate is not pressed, the second signal transmission line and the signal transmission terminal are not in contact with the cathode film; and
   wherein, when the first substrate is pressed, the second signal transmission line and the signal transmission terminal are in conductive connection with the cathode film.

2. The touch detecting structure of claim 1, wherein a portion of the cathode film opposite to the top of the protrusion is parallel to an end face of the signal transmission terminal on the top of the protrusion.

3. The touch detecting structure of claim 2, wherein the end face of the signal transmission terminal on the top of the protrusion and the second signal transmission line on the top of the protrusion have a same thickness.

4. The touch detecting structure of claim 1, wherein the first signal transmission line, the second signal transmission line, and the signal transmission terminal each are made of indium tin oxide.

5. The touch detecting structure of claim 1, wherein the insulating layer is made of an organic film.

6. The touch detecting structure of claim 1, further comprising a second signal transmission terminal arranged on a second lateral surface of the protrusion, wherein the second signal transmission line passes a top center of the protrusion.

7. The touch detecting structure of claim 1, wherein the second signal transmission line passes the top center of the protrusion.

8. The touch detecting structure of claim 1, wherein the second signal transmission line passes a top edge of the protrusion.

9. The touch detecting structure of claim 1, wherein a projection of the second signal transmission line on the second substrate is vertical to a projection of the first signal transmission line on the second substrate.

10. An organic light emitting touch display device comprising:
- a first substrate and a second substrate arranged opposite to each other, the second substrate having on a surface opposite to the first substrate an organic light emitting layer and a cathode film covering the organic light emitting layer;
- a group of parallel first signal transmission lines, arranged on a side of the first substrate opposite to the second substrate;
- an insulating layer, arranged on the first signal transmission lines and having a plurality of protrusions and a plurality of via holes;
- a group of parallel second signal transmission lines arranged on the insulating layer, each of the second signal transmission lines passing a top of one of the protrusions;
- a plurality of signal transmission terminals, each arranged on opposite lateral surfaces of a respective protrusion, wherein one end of each signal transmission terminal is connected with a first signal transmission line through a via hole, an opposite end of each signal transmission terminal is located on a top of a protrusion, and the signal transmission terminals are insulated from the second signal transmission lines; and
- the cathode film located on a surface of the second substrate opposite to the first substrate;
- wherein, when the first substrate is not pressed, the second signal transmission lines and the signal transmission terminals are not in contact with the cathode film; and
- wherein, when the first substrate is pressed, the second signal transmission lines and the signal transmission terminals are in direct conductive connection with the cathode film.

11. The device of claim 10, wherein projections of the second signal transmission lines on the second substrate are vertical to projections of the first signal transmission lines on the second substrate.

12. The device of claim 10, wherein:
- the first signal transmission lines and the second signal transmission lines are provided with initial electric signals according to an electric signal on the cathode film; and
- when there is a touch event at a crossing point of a first signal transmission line and a second signal transmission line, voltages of the first signal transmission line and the second signal transmission line are changed.

13. The device of claim 12, wherein when an electric signal connected to the cathode film is of low level, the first signal transmission lines and the second signal transmission lines are provided with initial electric signals of high level.

* * * * *